US012664108B2

(12) United States Patent
Prather

(10) Patent No.: US 12,664,108 B2
(45) Date of Patent: Jun. 23, 2026

(54) MEMORY DEVICES WITH MULTIPLE PSEUDO-CHANNELS

(71) Applicant: Micron Technology, Inc., Boise, ID (US)

(72) Inventor: Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 436 days.

(21) Appl. No.: 18/084,452

(22) Filed: Dec. 19, 2022

(65) Prior Publication Data

US 2023/0205712 A1 Jun. 29, 2023

Related U.S. Application Data

(60) Provisional application No. 63/293,399, filed on Dec. 23, 2021.

(51) Int. Cl.
| | |
|---|---|
| *G06F 13/16* | (2006.01) |
| *G06F 11/07* | (2006.01) |
| *G06F 13/38* | (2006.01) |
| *G06F 13/40* | (2006.01) |
| *G11C 11/4093* | (2006.01) |

(52) U.S. Cl.
CPC ...... *G06F 13/1694* (2013.01); *G06F 11/0787* (2013.01); *G06F 13/1689* (2013.01); *G06F 13/38* (2013.01); *G06F 13/409* (2013.01); *G11C 11/4093* (2013.01)

(58) Field of Classification Search
CPC ............. G06F 13/1694; G06F 11/0787; G06F 13/1689; G06F 13/38; G06F 13/409; G11C 11/409
See application file for complete search history.

(56) References Cited

U.S. PATENT DOCUMENTS

| | | | | |
|---|---|---|---|---|
| 12,524,298 B2 * | 1/2026 | Ayyapureddi | ...... | G06F 11/1004 |
| 2017/0199830 A1 * | 7/2017 | Nale | ................... | G11C 11/4096 |
| 2018/0232171 A1 * | 8/2018 | Berke | ..................... | G06F 13/16 |
| 2019/0043552 A1 * | 2/2019 | Alameer | ................. | G11C 5/04 |
| 2023/0178121 A1 * | 6/2023 | Nygren | ................. | G11C 7/222 |
| | | | | 365/189.05 |
| 2023/0350795 A1 * | 11/2023 | Liu | ..................... | G06F 13/1684 |

* cited by examiner

*Primary Examiner* — Mohammed A Bashar
(74) *Attorney, Agent, or Firm* — Dorsey & Whitney LLP

(57) ABSTRACT

A memory module is provided, comprising a connector and a plurality of memory devices. Each memory device includes a memory array and a plurality of data connections, wherein a first subset of the plurality of data connections are configured to communicate data with a first portion of the memory array, and a second subset of the plurality of data connections are configured to communicate data with a second portion of the memory array. The first subset of the plurality of data connections of each of the plurality of memory devices are connected in parallel to first external contacts of the connector in a first addressable pseudo-channel, and the second subset of the plurality of data connections of each of the plurality of memory devices are connected in parallel to second external contacts of the connector in a second addressable pseudo-channel.

18 Claims, 5 Drawing Sheets

Figure 6

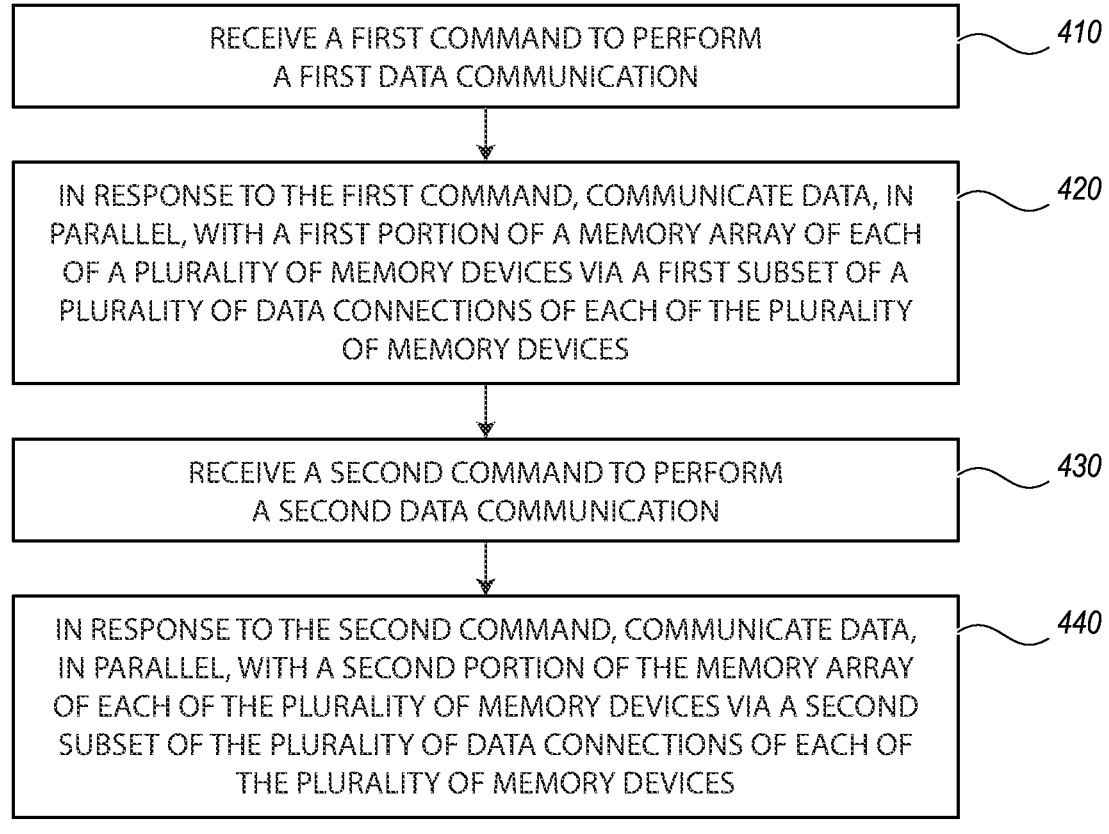

RECEIVE A FIRST COMMAND TO PERFORM A FIRST DATA COMMUNICATION — 410

IN RESPONSE TO THE FIRST COMMAND, COMMUNICATE DATA, IN PARALLEL, WITH A FIRST PORTION OF A MEMORY ARRAY OF EACH OF A PLURALITY OF MEMORY DEVICES VIA A FIRST SUBSET OF A PLURALITY OF DATA CONNECTIONS OF EACH OF THE PLURALITY OF MEMORY DEVICES — 420

RECEIVE A SECOND COMMAND TO PERFORM A SECOND DATA COMMUNICATION — 430

IN RESPONSE TO THE SECOND COMMAND, COMMUNICATE DATA, IN PARALLEL, WITH A SECOND PORTION OF THE MEMORY ARRAY OF EACH OF THE PLURALITY OF MEMORY DEVICES VIA A SECOND SUBSET OF THE PLURALITY OF DATA CONNECTIONS OF EACH OF THE PLURALITY OF MEMORY DEVICES — 440

MEMORY DEVICES WITH MULTIPLE PSEUDO-CHANNELS

CROSS-REFERENCE TO RELATED APPLICATION(S)

The present application claims priority to U.S. Provisional Patent Application No. 63/293,399, filed Dec. 23, 2021, the disclosure of which is incorporated herein by reference in its entirety.

TECHNICAL FIELD

The present disclosure generally relates to memory devices, and more particularly relates to methods for operating memory devices with multiple pseudo-channels and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

FIG. 6 is a flow chart illustrating a method of operating a memory device in accordance with an embodiment of the present technology.

DETAILED DESCRIPTION

Figure 1:
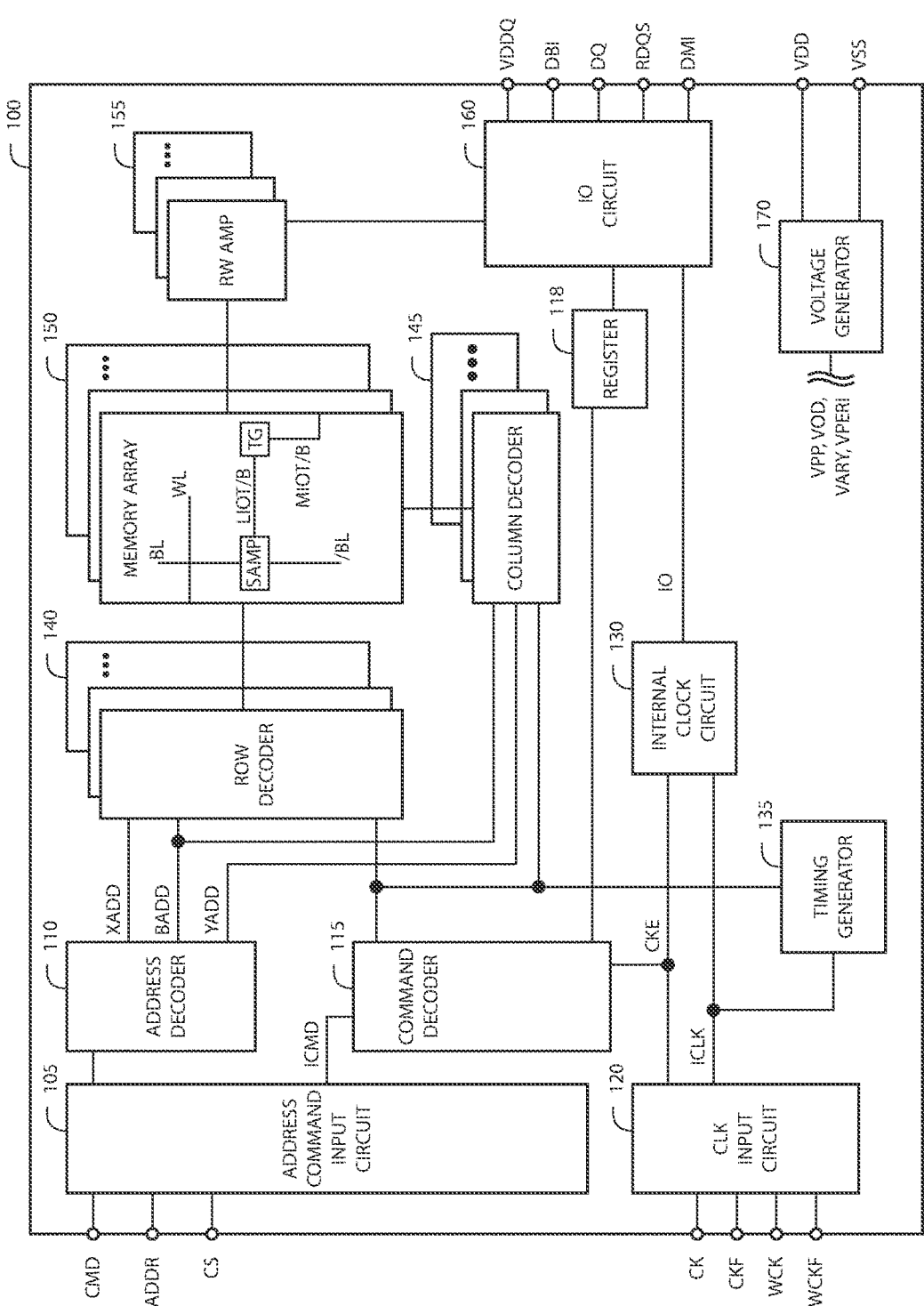
FIG. 1 is a simplified block diagram schematically illustrating a memory device in accordance with an embodiment of the present technology.

The communication of data between a DRAM module and a memory controller usually involves a fixed number of bits exchanged in response to a command (e.g., a read or a write command). The bits are communicated in parallel across a data bus to a number of memory devices on a module (e.g., the memory devices attached to a single shared channel), with each memory device including a number of data terminals (DQs) that each communicate a fixed number of bits per communication (i.e., the burst length that the memory devices are configured to use). As memory devices are configured to include a larger number of data terminals and to utilize larger burst lengths, it may take fewer and fewer memory devices per channel to provide sufficient bits to satisfy an access command. For example, when configured to use a 64 byte access (512 bits), a memory module with memory devices configured to use a 32 bit burst length and with four DQs each would use only four memory devices per channel (4 devices×4 DQs×32 bits per burst=512 bits per access).

Although in some circumstances, it may be desirable or at least non-disadvantageous to reduce the number of memory devices per channel on a memory module, there are circumstances in which a channel with a smaller number of memory devices can present challenges. For example, some memory modules provide additional memory devices (e.g., in addition to those configured to store user data) that are configured to store metadata (e.g., ECC data and/or parity data) in order to provide error detection and/or correction capability at a module level. One such approach, known as Single Device Data Correction (SDDC), involves providing an extra one or two dedicated memory devices for each channel of memory devices to store metadata for error detection and/or correction. As one of skill in the art will readily appreciate, the provision of one or two additional memory devices dedicated to metadata would represent a significant, potentially unacceptable overhead when a small number of memory devices per channel are used (e.g., channels with four memory devices for user data protected by two memory devices for metadata would have a 50% placement overhead).

Accordingly, several embodiments of the present technology are directed to memory devices, systems including memory devices, and methods of operating memory devices in which individual memory devices can be configured to operate with subsets of their memory arrays and data terminals arranged onto separate pseudo-channels. In this regard, a memory device with n data terminals can be configured to operate analogously to m separately-addressable memory devices, each including n/m data terminals and $m^{-1}$ of the device's memory array (e.g., a memory device with 8 DQs can be configured to operate as 2 memory devices with 4 DQs and ½ of the memory array each, or as 4 memory devices with 2 DQs and ¼ of the memory array each, etc.). Such a configuration can permit a small number of physical memory devices to be provided per channel, while reducing the placement overhead consumed by dedicated memory devices used for error detection and/or correction.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 may further include one or more registers 118 for storing various data (e.g., device status information). Mode registers 118 may include read-only bits, read-write bits, write-only bits, or any combination thereof. In some embodiments, mode registers 118 may be arranged in byte-sized addressable portions, with each individually-addressable mode register containing 8 bits. The read-write and write-only mode register bits may be written in response to mode register write (MRW) commands in which the data to be written is provided over the CA interface, and the read-write and read-only mode register bits may be read from in response to mode register read (MRR) commands in which the stored data output through the DQ data terminals. The mode registers 118 may also be read and written internally by various components of the memory device 100 (e.g., populating read-only mode register bits with device status information, determining a status of a write-only mode register bit, etc.), but without exchanging data with a terminal of the memory device.

Figure 2:
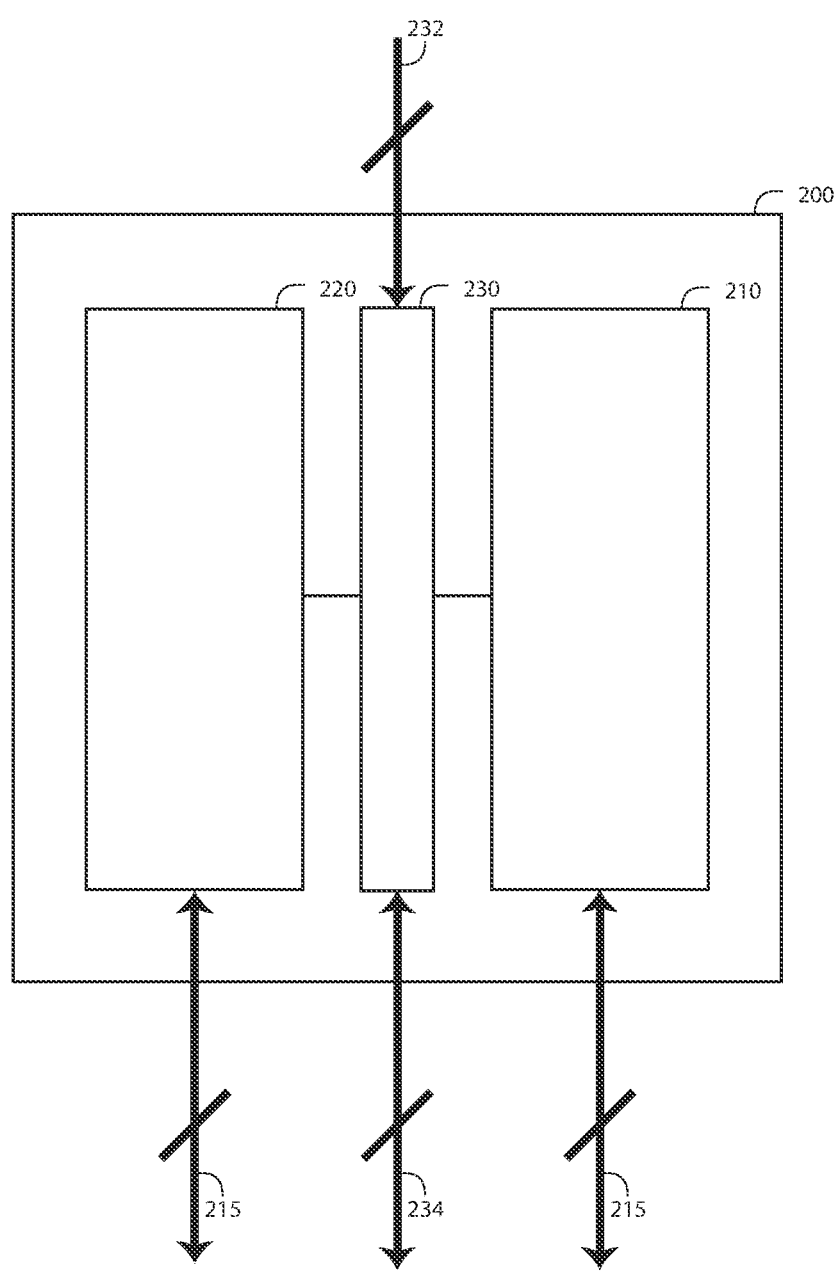
FIG. 2 is a simplified block diagram schematically illustrating a memory device in accordance with an embodiment of the present technology.

According to one embodiment of the present disclosure, a memory device such as memory device 100 can be configured to provide separately addressable access to a subset of its memory array using a corresponding subset of its data terminals. FIG. 2 is a simplified block diagram schematically illustrating one such memory device 200 in accordance with an embodiment of the present technology. Memory device 200 is configured to operate with two pseudo-channels, and therefore includes a memory array that is arranged into two sub-arrays 210 and 220 (e.g., each representing half of the total array space of memory device 200). Each sub-array 210 and 220 is operatively coupled to a corresponding subset of DQs, illustrated as DQ sub-bus 215 and 225, respectively. Additional circuitry 230 can be configured to communicate command/address information over a C/A bus 232 with the sub-arrays 210 and 220, and can similarly be configured to receive (e.g., during a write operation) or provide (e.g., during a read operation) data clocking signals (e.g., complimentary signals DQS_t and DQS_c) over a data clock bus 234.

As illustrated in FIG. 2, memory device 200 has been configured to operate with two pseudo-channels, such that the number of DQs corresponding to each channel is one half of the total number of DQs of the memory device 200.

For example, memory device 200 may be a ×8 DRAM device, such that each DQ sub-bus 215 and 225 communicates with respective sub-array 210 and 220 over a respective four of the eight DQs. Alternatively, memory device 200 may be a ×4 DRAM device, such that each DQ sub-bus 215 and 225 communicates with respective sub-array 210 and 220 over a respective two of the four DQs. In other embodiments, a memory device can be configured with a greater number of pseudo channels (e.g., four, eight, sixteen, or even non-powers-of-two, such as 3, 5, 6, etc.), with analogous subsets of its DQs. Although each pseudo-channel in the current example has been illustrated and described as including the same number of DQs that correspond with evenly-divided portions of the memory array, in other embodiments the total number of DQs of a memory device may be sub-divided into pseudo channels with different numbers of DQs, and the memory array may similarly be divided into unequal sub-arrays.

Figure 3:
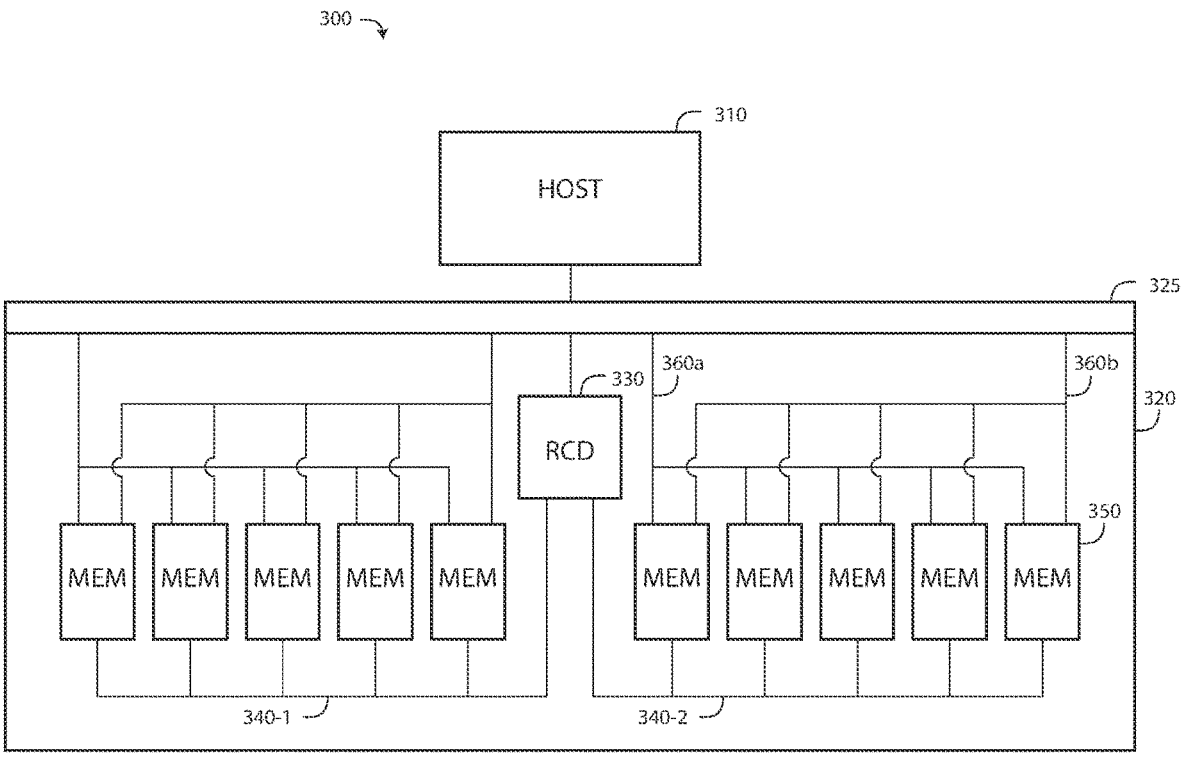
FIG. 3 is a simplified block diagram schematically illustrating a memory system in accordance with an embodiment of the present technology.

Turning to FIG. 3, a memory system including multiple memory devices, such as the memory device 200 of FIG. 2, is schematically illustrated in a simplified block diagram in accordance with an embodiment of the present technology. Memory system 300 includes a host device 310 operably coupled to a memory module 320 (e.g., a dual in-line memory module (DIMM)). Memory module 320 (e.g., a dual in-line memory module) can include a connector 325 (e.g., an edge connector) operably coupled to the host device 310. Memory module 320 can further include a plurality of memory devices 350 operably coupled to the connector 325 by data lines, illustrated as being organized into data bus 360a and 360b. Memory module 320 can further include a memory controller or registering clock driver (RCD) 330 operably coupled to both the connector 325 and the plurality of memory devices 350 by one or more command/address busses, such as C/A busses 340-1 and 340-2. Each of memory devices 350 can be configured, as illustrated in greater detail above with respect to FIG. 2, to operate on multiple pseudo-channels, by which the placement overhead of a memory device dedicated to error correction and/or detection metadata can be reduced.

In this regard, memory module 320 is illustrated as including ten memory devices 350 arranged into two ranks of five devices each. Each rank of five memory devices 350 can include four memory devices 350 dedicated to storing user data, with a fifth memory device 350 dedicated to storing metadata about the user data for error detection and/or correction. All five memory devices 350 in each rank can be similarly configured to operate with two pseudo-channels, such that the memory device 350 configured to store metadata can have half of its memory array dedicated to storing metadata about the halves of the memory arrays of the remaining four memory devices 350 connected to the same one of the data busses 360a and 360b. For example, in an embodiment in which each memory device 350 is a ×8 device (i.e., with eight DQs), each of the five memory devices 350 can be configured to operate on two pseudo-channels with four DQs and one-half of the memory array devoted to each pseudo-channel. Such an arrangement would, when operating with a burst length of 32 bits, provide two pseudo channels in which a 512 bit access was served by four memory devices outputting 32 bits on each of 4 DQs for 512 total bits of user data (protected by an additional 128 bits of metadata from the four DQs of the pseudo-channel of the memory device dedicated to metadata), for a 25% placement overhead.

Figures 4, 5:
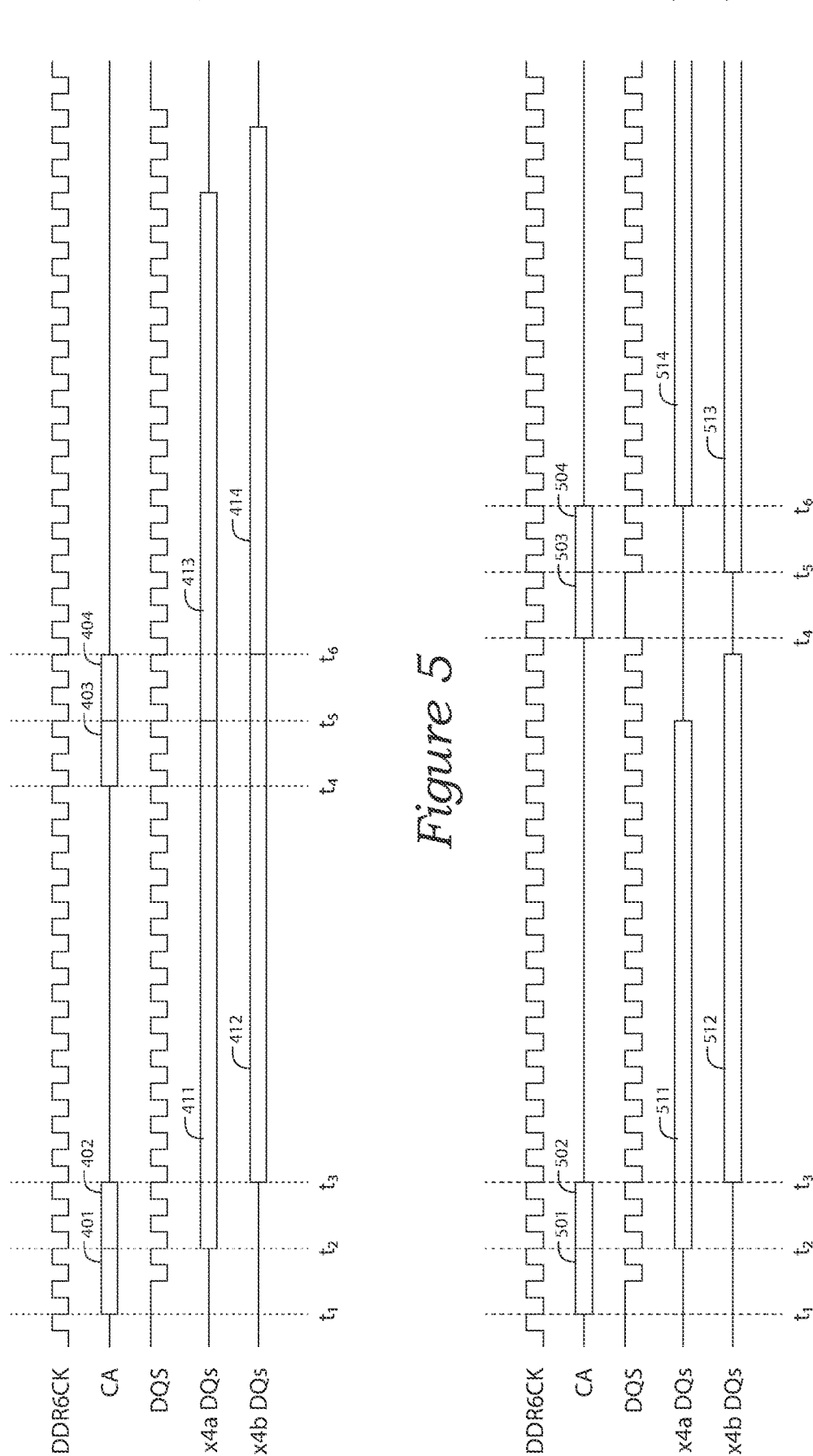
FIGS. 4 and 5 are timing diagrams illustrating a method of operating a memory device in accordance with an embodiment of the present technology.

FIGS. 4 and 5 are timing diagrams illustrating a method of operating a memory device in accordance with an embodiment of the present technology, with reference to which the foregoing feature of operating a memory device with multiple pseudo-channels may be more easily understood. As can be seen with reference to FIG. 4, a ×8 memory device is illustrated as operating with two pseudo-channels of four DQs each, arranged into ×4a and x4b DQs. In the operation of the memory device of FIG. 4, because the command/address bus is shared between the two pseudo-channels, commands directed to the different pseudo channels are sent at separate times, and accordingly the execution of those commands can be spaced apart by a delay. For example, at time $t_1$, a first command 401 is communicated (e.g., by a memory controller) over the C/A bus to the memory device, instructing (e.g., with a dedicated bit in the command identifying which pseudo-channel is being addressed) the first pseudo-channel to perform a data communication (e.g., a read or a write operation). Upon receipt, the command is executed, and a first data communication 411 is made over the DQs of the first pseudo-channel ×4a, beginning at time $t_2$. At time $t_2$, a second command 402 is communicated over the C/A bus to the memory device, instructing the second pseudo-channel to perform a second data communication 412 of the same kind as the first command (e.g., both are either read operations or write operations). Upon receipt, the command is executed, and the second data communication 412 is made over the DQs of the second pseudo-channel ×4b, beginning at time $t_3$. As can be seen with reference to FIG. 4, due to the shared C/A bus, the delay between execution of first and second commands 401 and 402 (and between the beginning of data communications 411 and 412) may be the duration of the first command 401. Because both operations are of the same type, the data clock DQS can be shared by both pseudo-channels, and the data communications 411 and 412 can overlap in time as shown. Moreover, additional operations of the same type can be seamlessly scheduled, as shown at times $t_4$ through $t_6$, where a third command 403 directed to the first pseudo-channel is received at time $t_4$ and executed at time $t_5$, and fourth command 404 directed to the second pseudo-channel is received at time $t_5$ and executed at time $t_6$, such that corresponding data communications 413 and 414 overlap in time and are performed without any delay on their respective data bus following data communications 411 and 412.

Turning to FIG. 5, a transition from one type of operation to another is illustrated, in which the shared nature of the data clock involves a delay between executing one type of data communication (e.g., a read operation) and another type (e.g., a write operation) as the data clock DQS switches from being device-driven to controller-driven or vice-versa, in accordance with one aspect of the disclosure. As can be seen with reference to FIG. 5, a ×8 memory device is illustrated as operating with two pseudo-channels of four DQs each, arranged into ×4a and ×4b DQs. In the present example embodiment, the memory device shares common circuitry for providing C/A signals to, and exchanging DQS clock signals with, both pseudo-channels. In the operation of the memory device of FIG. 5, because the command/address bus is shared between the two pseudo-channels, commands directed to the different pseudo channels are sent at separate times, and accordingly the execution of those commands can be spaced apart by a delay. For example, at time $t_1$, a first command 501 is communicated (e.g., by a memory controller) over the C/A bus to the memory device, instructing (e.g., with a dedicated bit in the command identifying which pseudo-channel is being addressed) the first pseudo-channel to perform a data communication (e.g., a read or a write operation). Upon receipt, the command is executed, and a first data communication 511 is made over the DQs of the first pseudo-channel ×4a, beginning at time $t_2$. At time $t_2$, a second command 502 is communicated over the C/A bus to the memory device, instructing the second pseudo-channel to perform a second data communication 512 of the same kind as the first command (e.g., both are either read operations or write operations). Upon receipt, the command is executed, and the second data communication 512 is made over the DQs of the second pseudo-channel ×4b, beginning at time $t_3$. Because both operations are of the same type, the data clock DQS can be shared by both pseudo-channels, and the data communications 511 and 512 can overlap in time as shown. Once both operations are complete, the memory device can transition to an operation of another type (e.g., from a read to a write, or vice-versa), as is illustrated at times $t_4$ through $t_6$. As can be seen with reference to FIG. 5, at time $t_4$ the data communications corresponding to both the first and second commands 501 and 502 have completed, and the data clock DQS accordingly stops toggling. Also at time $t_4$, a third command 503 directed to the second pseudo-channel is received, and is executed at time $t_5$, when a third data communication 513 begins as the data clock DQS begins toggling again (e.g., driven by a connected controller or RCD during a write operation, rather than internally generated as during a read operation). At time $t_5$, a fourth command 504 directed to the first pseudo-channel is received, and is executed at time $t_6$, when a fourth data communication 514 begins, overlapping with the third data communication 513.

In the foregoing example embodiments, memory devices have been illustrated and described as sharing common circuitry for providing C/A signals to, and exchanging DQS clock signals with, both pseudo-channels of a memory device. In other embodiments, by increasing the pin count of the memory device, either or both of these signals could be provided separately to the two pseudo-channels, to permit more sophisticated scheduling (e.g., simultaneous command delivery to both pseudo-channels when separate C/A pins are provided) and simultaneous read and write operations (e.g., using internally-generated DQS signals to clock data out for a read operation simultaneously with externally-generated DQS signals to clock data in for a write operation) among the pseudo-channels.

In accordance with another aspect of the present disclosure, the foregoing approach to operating a memory device with multiple pseudo-channels can be enabled or disabled by an end user of the memory device and/or memory modules. For example, in an embodiment in which the feature is configurable, the feature may be enabled or disabled by changing a corresponding mode register value or sending a dedicated enable/disable command to the devices. Other approaches to enabling and disabling the foregoing feature may also be used, such as changing an applied voltage to a memory device input, or the like.

FIG. 6 is a flow chart illustrating a method of operating a memory system (e.g., a memory module including one or more memory devices) in accordance with an embodiment of the present technology. The method includes receiving a first command to perform a first data communication (box 610). According to one aspect of the present disclosure, the receiving features of box 610 may be implemented with the command/address input circuit 105 and/or C/A bus 232, as illustrated in FIGS. 1 and 2 in greater detail, above. The method further includes, in response to the first command, communicating data concurrently (e.g., in parallel) with a first portion of a memory array of each of a plurality of memory devices via a first subset of a plurality of data connections of each of the plurality of memory devices (box 620). According to one aspect of the present disclosure, the communicating features of box 620 may be implemented with the input/output circuit 160, sub-array 210, and/or DQ sub-bus 215, as illustrated in FIGS. 1 and 2 in greater detail, above. The method further includes receiving a second command to perform a second data communication (box 630). According to one aspect of the present disclosure, the receiving features of box 630 may be implemented the command/address input circuit 105 and/or C/A bus 232, as illustrated in FIGS. 1 and 2 in greater detail, above. The method further includes, in response to the second command, communicating data concurrently (e.g., in parallel) with a second portion of the memory array of each of the plurality of memory devices via a second subset of the plurality of data connections of each of the plurality of memory devices (box 640). According to one aspect of the disclosure, communicating data with the first portion of the memory array of each of the plurality of memory devices overlaps in time with communicating data with the second portion of the memory array of each of the plurality of memory devices. According to a further aspect of the present disclosure, the communicating features of box 640 may be implemented with the input/output circuit 160, sub-array 210, and/or DQ sub-bus 215, as illustrated in FIGS. 1 and 2 in greater detail, above.

It should be noted that the methods described above describe possible implementations, and that the operations and the steps may be rearranged or otherwise modified and that other implementations are possible. Furthermore, embodiments from two or more of the methods may be combined.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having nine memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus comprising:

a connector; and a plurality of memory devices, each of the memory devices having a memory array, a command/address bus having a plurality of command/address connections, and a set of data connections, wherein a first subset of the set of data connections is configured to communicate data with a first portion of the memory array, and a second subset of the set of data connections is configured to communicate data with a second portion of the memory array, and wherein each of the plurality of command/address connections in the command/address bus are coupled to both the first portion of the memory array in a first addressable pseudo-channel and to the second portion of the memory array in a second addressable pseudo-channel;

wherein data connections of the first subset of each memory device of the plurality of memory devices are connected in parallel to first external contacts of the connector in the first addressable pseudo-channel, and wherein data connections of the second subset of each memory device of the plurality of memory devices are connected in parallel to second external contacts of the connector in the second addressable pseudo-channel.

2. The apparatus of claim 1, wherein each memory device of the plurality of memory devices includes a plurality of data strobe connections that are each coupled both to the first portion of the memory array and to the second portion of the memory array.

3. The apparatus of claim 1, further comprising a registering clock driver coupled between the connector and the command/address bus of each memory device of the plurality of memory devices.

4. The apparatus of claim 1, wherein the plurality of memory devices comprises:

a first set of memory devices configured to store data, and a second set of memory devices configured to store error detection and/or correction metadata corresponding to the data.

5. The apparatus of claim 4, wherein the second set contains only a single memory device.

6. The apparatus of claim 1, wherein the plurality of memory devices comprises dynamic random-access memory (DRAM) devices.

7. The apparatus of claim 1, wherein the connector is an edge connector of a dual in-line apparatus (DIMM).

8. An apparatus comprising:

a plurality of memory devices, each of the plurality of memory devices having a memory array, a plurality of command/address connections, and a set of data connections, wherein a first subset of the set of data connections is configured to communicate data with a first portion of the memory array, and a second subset of the set of data connections is configured to communicate data with a second portion of the memory array, and wherein each of the plurality of command/address connections are each coupled to both the first portion of the memory array and to the second portion of the memory array;

wherein the apparatus is configured to perform a first data communication with the first subset of each memory device of the plurality of memory devices and a second data communication with the second subset of each memory device of the plurality of memory devices, wherein the first data communication and the second data communication overlap in time.

9. The apparatus of claim 8, wherein the first data communication is offset from the second data communication by a delay corresponding to a duration of a command to perform the second data communication.

10. The apparatus of claim 8, wherein each memory device of the plurality of memory devices includes a plurality of data strobe connections that are each coupled both to the first portion of the memory array and to the second portion of the memory array.

11. The apparatus of claim 8, further comprising a registering clock driver coupled between a connector and the plurality of command/address connections of each memory device of the plurality of memory devices.

12. The apparatus of claim 8, wherein the plurality of memory devices comprises:

a first set of memory devices configured to store data, and a second set of memory devices configured to store error detection and/or correction metadata corresponding to the data.

13. The apparatus of claim 8, wherein the first data communication and the second data communication are either both read operations or both write operations.

14. A method comprising:

receiving a first command to perform a first data communication;

in response to the first command, routing the first command to a first portion of a memory array of each memory device of a plurality of memory devices via a plurality of command/address busses individually corresponding to the plurality of memory devices; and communicating data concurrently with the first portion of the memory array of each memory device of the plurality of memory devices via a first subset of a set of data connections of each memory device of the plurality of memory devices;

receiving a second command to perform a second data communication; and in response to the second command, routing the second command to a second portion of the memory array of each memory device of the plurality of memory devices via the plurality of command/address busses individually corresponding to the plurality of memory devices; and communicating data concurrently with a second portion of the memory array of each memory device of the plurality of memory devices via a second subset of the set of data connections of each of the plurality of memory devices.

15. The method of claim 14, wherein communicating data with the first portion of the memory array of each memory device of the plurality of memory devices overlaps in time with communicating data with the second portion of the memory array of each memory device of the plurality of memory devices.

16. The method of claim 14, wherein communicating data with the first portion of the memory array of each memory device of the plurality of memory devices and communicating data with the second portion of the memory array of each memory device of the plurality of memory devices comprises either two read operations or two write operations.

17. The method of claim 14, wherein communicating data with the first portion of the memory array of each memory device of the plurality of memory devices is offset from communicating data with the second portion of the memory array of each memory device of the plurality of memory devices by a delay corresponding to a duration of the second command.

18. The method of claim 14, wherein the data comprises user data stored in a first subset of the plurality of memory devices and error detection and/or correction metadata stored in a second subset of the plurality of memory devices.

* * * * *